(12) United States Patent
Zhou (10) Patent No.: US 10,714,469 B2
(45) Date of Patent: Jul. 14, 2020

(54) ELECTROSTATIC DISCHARGE PROTECTION STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/427,711

(22) Filed: May 31, 2019

(65) Prior Publication Data

US 2019/0287958 A1 Sep. 19, 2019

Related U.S. Application Data

(62) Division of application No. 15/725,854, filed on Oct. 5, 2017, now Pat. No. 10,354,993.

(30) Foreign Application Priority Data

Aug. 12, 2016 (CN) .......................... 2016 1 0666917

(51) Int. Cl.
*H01L 23/62* (2006.01)
*H01L 27/02* (2006.01)
(Continued)

(52) U.S. Cl.
CPC ...... *H01L 27/0266* (2013.01); *H01L 21/3081* (2013.01); *H01L 21/30604* (2013.01); *H01L 21/823418* (2013.01); *H01L 21/823431* (2013.01); *H01L 21/823481* (2013.01); *H01L 27/0207* (2013.01); *H01L 27/0886* (2013.01); *H01L 29/0649* (2013.01); *H01L 29/0847* (2013.01); *H01L 29/1037* (2013.01); *H01L 29/42368* (2013.01); *H01L 29/42376* (2013.01); *H01L 21/31111* (2013.01); *H01L 21/823437* (2013.01)

(58) Field of Classification Search
CPC .......... H01L 21/30604; H01L 21/3081; H01L 21/823431; H01L 27/0266
USPC ......................................... 257/355, 356, 360
See application file for complete search history.

(56) References Cited

U.S. PATENT DOCUMENTS 8,754,486 B2 * 6/2014 Lee ........................ H01L 27/088
257/308
9,916,978 B2 3/2018 Hsu et al.
(Continued)

FOREIGN PATENT DOCUMENTS

DE 102013101705 A1 5/2014
EP 2889906 A1 7/2015

*Primary Examiner* — Tan N Tran
(74) *Attorney, Agent, or Firm* — Anova Law Group, PLLC (57) ABSTRACT

An electrostatic discharge protection structure is provided and includes a base substrate including a substrate and a fin portion on the substrate. The substrate includes a first region and a second region. A first doped layer is on a surface of the fin portion in the first region. A second doped layer is on a surface of the fin portion in the second region and on a surface of the substrate in the second region.

14 Claims, 6 Drawing Sheets

(51) Int. Cl.
*H01L 21/306* (2006.01)
*H01L 21/308* (2006.01)
*H01L 21/8234* (2006.01)
*H01L 27/088* (2006.01)
*H01L 29/06* (2006.01)
*H01L 29/08* (2006.01)
*H01L 29/10* (2006.01)
*H01L 29/423* (2006.01)
*H01L 21/311* (2006.01)

(56) References Cited

U.S. PATENT DOCUMENTS

| | | | |
|---|---|---|---|
| 10,354,993 B2 * | 7/2019 | Zhou | ................... H01L 27/0886 |
| 2015/0311342 A1 | 10/2015 | Lin et al. | |
| 2016/0093730 A1 | 3/2016 | Li | |
| 2016/0181358 A1 | 6/2016 | Zhang et al. | |

\* cited by examiner

FIG. 11

ELECTROSTATIC DISCHARGE PROTECTION STRUCTURE

CROSS-REFERENCES TO RELATED APPLICATIONS

This application is a divisional of U.S. patent application Ser. No. 15/725,854, filed on Oct. 5, 2017, which claims the priority of Chinese Patent Application No. 201610666917.4, filed on Aug. 12, 2016, the entire contents of which are incorporated herein by reference.

FIELD OF THE DISCLOSURE

The present disclosure generally relates to the field of semiconductor fabricating technology and, more particularly, relates to an electrostatic discharge protection structure.

BACKGROUND

With the rapid development of semiconductor manufacturing technology, semiconductor devices are developing towards a direction of higher component density and a higher degree of integration. Transistors as the most basic semiconductor devices are currently being widely used and, with the increasing of the semiconductor device component density and the integration degree, the transistor size is getting smaller and smaller.

In a fin field effect transistor (Fin FET), the channel is projected over the surface of the substrate to form a fin structure, and the gate covers the top and sidewalls of the fin structure. As such, the inversion layer formed on each side of the channel can control the turning-on and turning-off of the circuit on both sides, thereby greatly improving the circuit control and reducing the leakage current. In addition, the 3D architecture of a Fin FET can improve the integration of the Fin FET. However, the width of the fin structure of a Fin FET may be relatively narrow, which can make the cooling of the Fin FET to be a significant challenge. Therefore, a self-heat problem of the Fin FET may be caused, which can damage the fin structure of the Fin FET.

Especially, in an electrostatic discharge circuit, a large electrostatic current generated by external circuitry can flow into the drain of the electrostatic discharge circuit, which may easily lead to a sharp increase of the temperature of the drain, causing an instable performance of the electrostatic discharge device. Therefore, the heat dissipation performance of the electrostatic discharge circuit has a significant impact on the electrostatic discharge device.

Accordingly, the existing fin field-effect transistors have the disadvantages of poor heat dissipation and instable transistor performance. The disclosed electrostatic discharge protection structure and fabricating method thereof are directed to solve one or more problems set forth above and other problems.

BRIEF SUMMARY OF THE DISCLOSURE

One aspect of present disclosure provides an electrostatic discharge protection structure. The electrostatic discharge protection structure includes a base substrate including a substrate and a fin portion on the substrate. The substrate includes a first region and a second region. The electrostatic discharge protection structure further includes a first doped layer on a surface of the fin portion in the first region; and a second doped layer on a surface of the fin portion in the second region and on a surface of the substrate in the second region.

Another aspect of present disclosure provides a method for fabricating an electrostatic discharge protection structure. The method includes providing a base substrate including a first region and a second region. The base substrate in the second region includes a substrate and a fin portion on the substrate. The method further includes forming a first doped layer on a surface of a fin portion in the first region; and forming a second doped layer on a surface of the fin portion in the second region and on a surface of the substrate in the second region.

Other aspects of the disclosed subject matter can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference input now be made in detail to exemplary embodiments of the invention, which are illustrated in the accompanying drawings in order to fully understand and to be able to implement the present disclosure and to realize the technical effect. It should be understood that the following description has been made only by way of example, but not to limit the present disclosure. Various embodiments of the present disclosure and various features in the embodiments that are not conflicted with each other can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

In accordance with various embodiments, the present disclosure provides an electrostatic discharge protection structure and a fabricating method thereof.

There are certain issues with some existing methods for fabricating an electrostatic discharge protection structure. For example, the formed electrostatic discharge protection structure may have a poor heat dissipation performance. The reasons why the electrostatic discharge protection structure is difficult to dissipate heat can be analyzed in the following.

Figure 1:
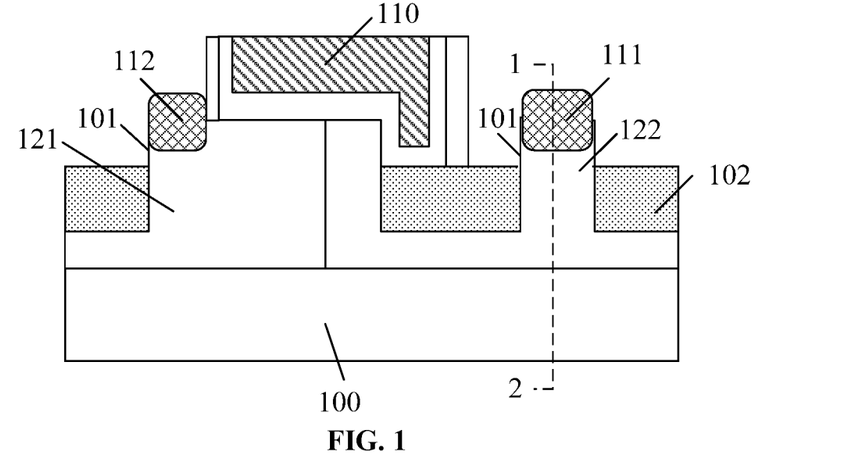
FIGS. 1 and 2 illustrate schematic structural views of an electrostatic discharge protection structure.
Figure 2:
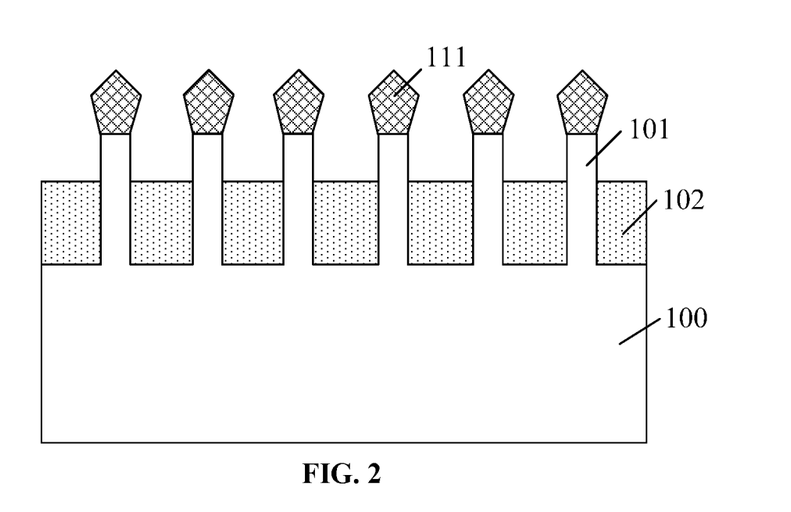

Referring to FIGS. 1 and 2, schematic structural views of an electrostatic discharge protection structure are shown.

FIG. 2 illustrate a cross-sectional view of the electrostatic discharge protection structure shown in FIG. 1 along a dashed line 1-2.

As illustrated, the electrostatic discharge protection structure includes a substrate 100, a fin portion 101, a first well region 121, a second well region 122, an isolation structure 102, a gate structure 110, a source region 112, and a drain region 111.

The fin portion 101 is on the substrate 100. The first well region 121 is in the fin portion 101 and the substrate 100. The second well region 122 is in the fin portion 101 and the substrate 100, and is in contact with the first well region 121. The isolation structure 102 is on the substrate 100, and covers a part of sidewalls of the fin portion 101. The gate structure 110 spans the fin portion 101, and covers a part of the sidewalls and top surface of the fin portion 101. The source region 112 and the drain region 111 are in the fin portion 101, and on the two sides of the gate structure 110 respectively.

When the electrostatic discharge protection structure is in operation, a large amount of electrostatic current can flow into the drain region 111 to generate a large amount of heat. Since the drain region 111 is in contact with only the fin portion 101, and the contact area between the drain region 111 and the substrate is small, the heat generated by the electrostatic current is hardly released. Thus, a sharp rise of the temperature of the electrostatic discharge protection structure can be caused, which is liable to damage the fin portion 101, and thereby resulting in an unstable performance of the electrostatic discharge device.

In order to solve the above described technical problem, the present disclosure provides an improved method for fabricating an electrostatic discharge protection structure. The method can include the following steps. First, a base substrate including a first region and a second region can be provided. The second region of the substrate can include a substrate and a fin portion on the substrate. Further, a first doped layer can be formed on the base substrate in the first region. Then, a second doped layer can be formed on the surface of the fin portion and the surface of the based substrate in the second region.

During the formation of the second doped layer, the second doped layer is formed not only on the surface of the fin portion in the second region, but also on the surface of the base substrate in the second region. As such, the contact area between the second doped layer and the base substrate can be enlarged, thereby increasing the current flow through the cross-sectional area of the channel. Therefore, the disclosed method can increase the heat dissipation performance of the formed electrostatic discharge protection structure, and can improve the performance of the formed electrostatic discharge protection structure.

The foregoing purposes, features and advantages of the present disclosure will become more apparent from the following detailed description of various embodiments of the present disclosure when taken in conjunction with the accompanying drawings.

Figure 10:
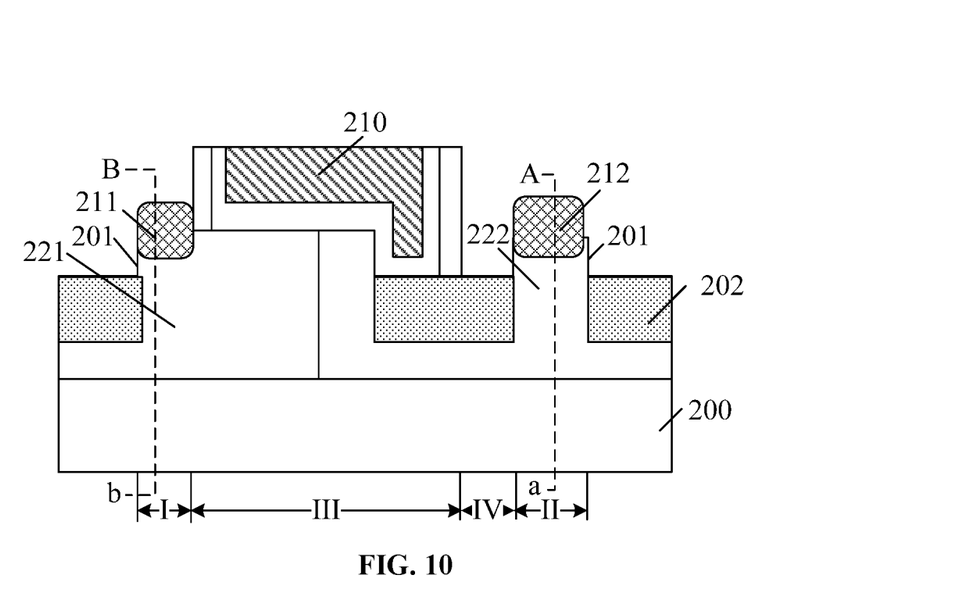
Figure 11:
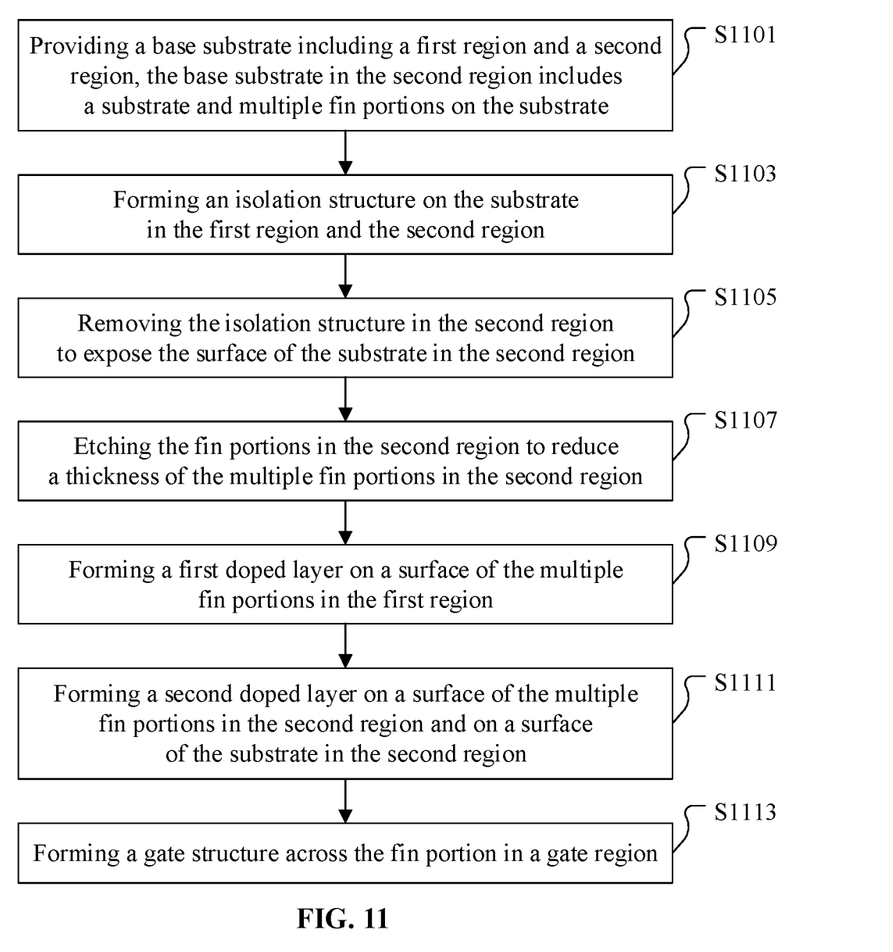
FIG. 11 illustrates a schematic flow diagram of an exemplary method for fabricating an electrostatic discharge protection structure in accordance with some embodiments of the disclosed subject matter.

Referring to FIG. 11, a schematic flow diagram of an exemplary process for fabricating an electrostatic discharge protection structure is shown in accordance with some embodiments of the disclosed subject matter. FIGS. 3-10 illustrate schematic structural views of an exemplary electrostatic discharge protection structure at certain stages of the fabricating process shown in FIG. 11.

It should be noted that, the drain of the electrostatic discharge structure under an effect of a large electrostatic current is easy to produce large amounts of heat. Therefore, the electrostatic discharge protection structure has a high requirement of the heat dissipation performance. In the following described embodiments, the method for fabricating the electrostatic discharge protection structure according to the present disclosure is described in details by using the heat dissipation performance of the electrostatic discharge protection structure as an example. However, the method of the present disclosure is not limited to fabricate the electrostatic discharge protection structure, but can also be applied to the formation of other semiconductor devices such as diodes and transistors.

Figure 3:
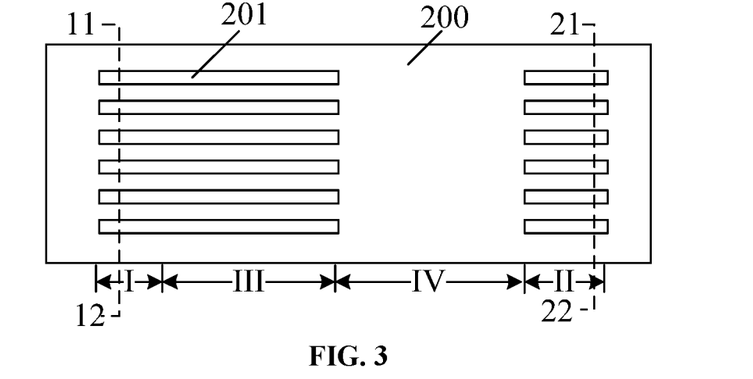
FIGS. 3-10 illustrate schematic structural views of an exemplary electrostatic discharge protection structure at certain stages of a fabricating process in accordance with some embodiments of the disclosed subject matter.
Figure 4:
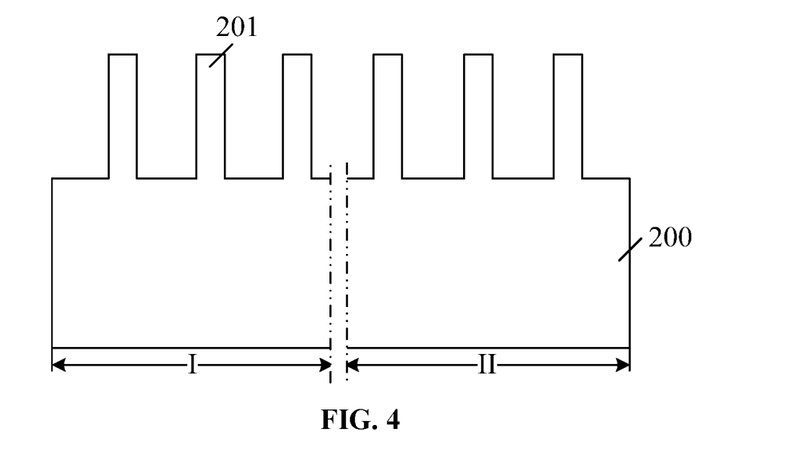

As shown in FIG. 11, at step S1101, a base substrate including a first region and a second region can be provided. The base substrate in the second region can include a substrate and multiple fin portions on the substrate Referring to FIGS. 3 and 4, the first region I in FIG. 4 shows a cross-sectional view of the structure in FIG. 3 along the dashed line 11-12, and the second region II in FIG. 4 shows a cross-sectional view of the structure in FIG. 3 along the dashed line 21-22.

As illustrated, a base substrate including the first region I and the second region II can be provided. The second region II of the base substrate includes a substrate 200 and multiple fin portions 201 on the substrate 200.

In some embodiments, the first region I can be used for forming a source region, and the second region II can be used for forming a drain region. In some other embodiments, the first region can be used d to form a drain region, and the second region can be used to form a source region.

In some embodiments, the base substrate in the first region I can also include the substrate 200 and the multiple fin portions 201 on the substrate 200.

In some embodiments, the base substrate can include multiple fin portions 201 on the substrate 200 in the second region II, as well as multiple fin portions 201 on the substrate 200 in the first region I.

In some embodiments, the base substrate can further include a gate region III between the first region I and the second region II. The gate region III can be used for forming a gate structure. The base substrate can further include an isolation region IV between the gate region III and the second region II. In some other embodiments, the base substrate may not include the gate region and the isolation region.

In some embodiments, the process of forming the base substrate can include the following steps. First, an initial substrate can be provided. FurtherFurther, the initial substrate can be patterned to form the substrate 200 and initial fin portions on the substrate 200. Then, the initial fin portions on the isolation region IV can be removed to form the multiple fin portions 201.

In some embodiments, the substrate 200 can be a silicon substrate. In some other embodiments, the substrate 200 may also be a semiconductor substrate such as a germanium substrate, a silicon germanium substrate, or a silicon-on-insulator substrate.

In some embodiments, the material of the multiple fin portions 201 can be silicon. In some other embodiments, the material of the multiple fin portions 201 may also be germanium or silicon germanium.

In some embodiments, the initial fin portions on the isolation region IV can be removed by using a dry etching method or a wet etching method.

In some embodiments, after forming the base substrate, the method can further include the following steps. A first well region (not shown in the figures) can be formed in the base substrate in the first region I and the gate region III. A second well region (not shown in the figures) can be formed in the base substrate in the gate region III, the isolation region IV and the second region II. The second well region can be in contact with the first well region.

In some embodiments, the first well region has first dopant ions, and the second well region has second dopant ions. The type of the second dopant ions is opposite with the type of the first dopant ions. For example, the type of the first dopant ions is N-type and the type of the second dopant ions is P-type. As another example, the type of the first dopant ions is P-type and the type of the second dopant ions is N-type.

Referring to FIGS. 5 to 9, schematic views of the electrostatic discharge protection structure in certain subsequent steps on the basis of FIG. 4.

Returning to FIG. 11, at step S1103, an isolation structure can be formed on the substrate in the first region and the second region.

Figure 5:
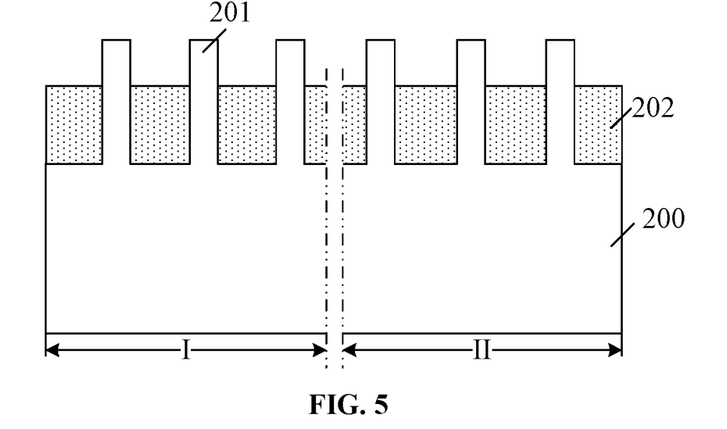

Referring to FIG. 5, an isolation structure 202 can be formed on the substrate in the first region I and the second region II. The isolation structure 202 can cover a portion of sidewalls of the multiple fin portions 201. A top surface of the isolation structure 202 can be lower than the top surface of the multiple fin portions 201.

The isolation structure 202 can be used to achieve an isolation between the multiple fin portions 201 in the first region I for reducing the leakage current.

In some embodiments, the material of the isolation structure 202 can be silicon oxide. In some other embodiments, the material of the isolation structure 202 may also be silicon oxynitride.

In some embodiments, a process for forming the isolation structure 202 can include the following steps. First, an initial isolation structure can be formed to cover the sidewalls and the top surface of the multiple fin portions 201. Further, the initial isolation structure can be etched to form the isolation structure 202, such that the top surface of the isolation structure 202 is lower than the top surface of the multiple fin portions 201 top surface.

In some embodiments, the method of etching the initial isolation structure can include a dry etching process. In some other embodiments, the method of etching the initial isolation structure may also include a wet etching process.

It should be noted that, the isolation structure 202 can also cover the substrate 200 in the isolation region IV, as shown in FIG. 3. The isolation structure 202 on the substrate 200 in the isolation region IV can be used to increase the length of the channel that the current flows through, thereby the heat dissipation performance of the formed electrostatic discharge protection structure can be enhanced.

The isolation structure 202 can also be located on the substrate 200 between the multiple fin portions 201 in the gate region III.

Returning to FIG. 11, at step 1105, the isolation structure in the second region to expose the surface of the substrate in the second region.

Figure 6:
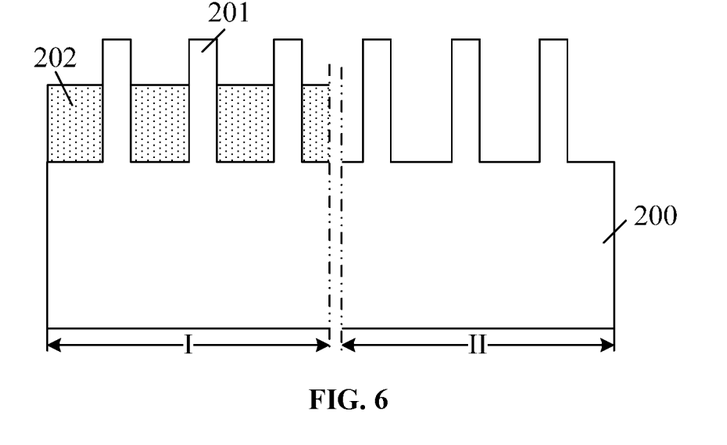

Referring to FIG. 6, the isolation structure 202 on the substrate 200 in the second region II can be removed to expose the surface of the substrate 200 in the second region II.

The surface of the substrate 200 in the second region II is exposed to enable the formation of a subsequently formed second doped layer on the surface of the substrate 200 in the second region II. As such, the contact area between the second doped layer and the base substrate can be increased, thereby increasing the cross-sectional area of the channel that the current flows through. Therefore, the heat dissipation performance of the formed electrostatic discharge protection structure can be enhanced.

In some embodiments, the process for removing the isolation structure 202 on the substrate 200 in the second region II can include the following steps. First, a first photoresist film can be formed on the substrate 200 in the first region I. The first photoresist film can cover the sidewalls and top surface of the multiple fin portions 201 in the first region I. Further, the isolation structure 202 can be etched by using the first photoresist film as a mask. The isolation structure 202 on the substrate 200 in the second region II can be removed. Finally, the first photoresist film can be removed.

In some embodiments, the method of removing the isolation structure 202 on the substrate 200 in the second region II can include a wet etching process, a dry etching process, or a combination thereof.

In some embodiments, the isolation structure 202 on the substrate 200 in the second region II can be removed, and the isolation structure 202 on the substrate 200 in the first region I can be retained.

In some other embodiments, the isolation structure on the substrate in the first region may also be removed during the removal of the isolation structure on the substrate in the second region. As such, the substrate in the first region can be exposed. Therefore, in a subsequent epitaxial growth process, a first doped region can also be formed on the substrate in the first region, thereby further enhancing the heat dissipation performance of the formed electrostatic discharge protection structure.

It should be noted that, in some other embodiments, the substrate does not include the gate region and the isolation region, so that the fabricating method may not include the steps of forming the isolation structure and removing the isolation structure in the second region.

Returning to FIG. 11, at step 1107, the multiple fin portions in the second region can be etched to reduce a thickness of the multiple fin portions in the second region.

Figure 7:
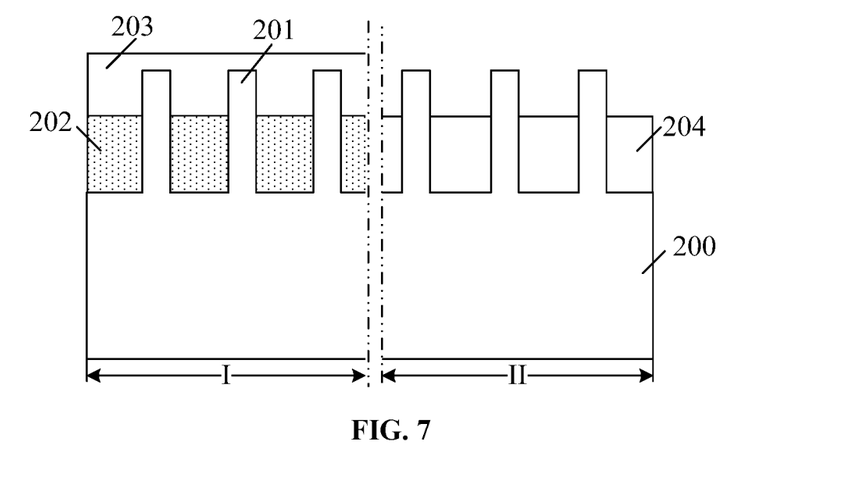
Figure 8:
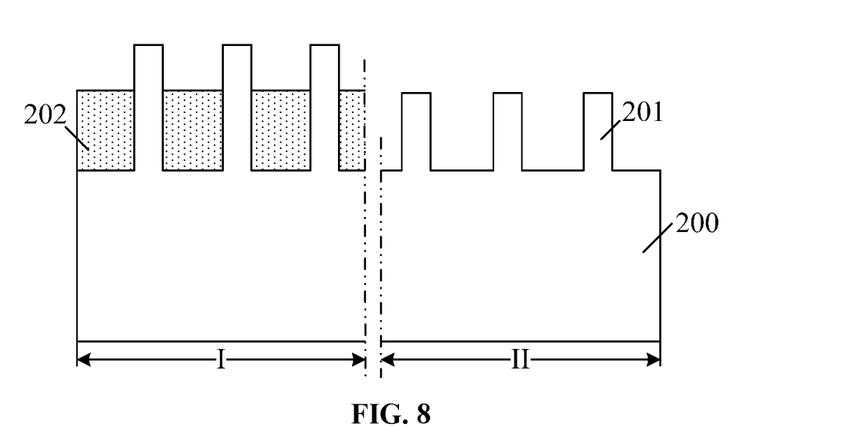

Referring to FIGS. 7 and 8, in some embodiments, after the isolation structure 202 in the second region II is removed, the fabricating method can subsequently include etching the multiple fin portions 201 in the second region II to reduce the thickness of the multiple fin portions 201 in the second region II.

As shown in FIG. 7, a first sacrificial layer 203 can be formed in the first region I. The first sacrificial layer 203 can cover the sidewalls and top surface of the multiple fin portions 201 in the first region I. A second sacrificial layer 204 can be formed on the substrate 200 in the second region II. The top surface of the second sacrificial layer 204 can be lower than the top surface of the multiple fin portions 201 in the second region II.

In some embodiments, the base substrate can further include the gate region III between the first region I and the second region II, as shown in FIG. 3. And the first sacrificial layer 203 can also cover the sidewalls and top surface of the multiple fin portions 201 in the gate region III.

In some embodiments, the first sacrificial layer 203 and the second sacrificial layer 204 can be antireflective coatings. The antireflective coatings can be organic antireflective coatings, since a removal process of the organic antireflective coatings is relatively simple. In some other embodiments, the material of the first sacrificial layer and the second sacrificial layer may also be silicon oxide, silicon nitride, or silicon oxynitride.

In some embodiments, the process of forming the first sacrificial layer 203 and the second sacrificial layer 204 can include the following steps. Firstly, an initial sacrificial layer can be formed to cover the substrate in the first region I, the second region II, and the gate region III. Then, a second photoresist film can be formed on the initial sacrificial layer in the first region I and the gate region III. Further, the initial sacrificial layer can be etched by using the second photoresist film as a mask, such that the top surface of the initial sacrificial layer in the second region II is lower than the top surface of the multiple fin portions 201 in the second region II. Finally, the second photoresist film can be removed.

In some embodiments, the method of etching the initial sacrificial layer by using the second photoresist film as a mask can include a dry etching process or a wet etching process.

In some other embodiments, if the substrate in the first region does not have an isolation structure, the first sacrificial layer may not cover the first region substrate, thereby exposing the multiple fin portions in the first region.

Referring to FIG. 8, the multiple fin portions 201 in the second region II can be etched to reduce the height of the multiple fin portions 201 in the second region II.

In some embodiments, the height of the multiple fin portions 201 in the second region II can be reduced to decrease the aspect ratio of the gaps between adjacent fin portions 201 in the second region II. As such, during the formation of the second doped layer, the reactant can be sufficiently in contact with the substrate 200 in the second region II to form the second doped layer on the substrate 200 in the second region II.

In some embodiments, the multiple fin portions 201 in the second region II can be etched using the first sacrificial layer 203 and the second sacrificial layer 204 as masks.

In some embodiments, after etching the multiple fin portions 201 in the second region II, when the height of the multiple fin portions 201 in the second region II is too small, a contact area between the subsequently formed second doped layer and the sidewalls of the multiple fin portions 201 may be too small to improve the heat dissipation performance of the formed electrostatic discharge protection structure. When the height of the multiple fin portions 201 in the second region II is too large, it is difficult to reduce the difficulty of contacting the reaction gas with the substrate 200 in the second region II during the formation of the second doped layer. As such, it may not be easy to form the second doped layer on the substrate 200 in the second region II. Specifically, after etching the multiple fin portions 201 in the second region II, the height of the multiple fin portions 201 in the second region II can be in a range from 150 angstroms to 800 angstroms.

In some embodiments, after etching the multiple fin portions 201 in the second region II, the depth-to-width ratio of the gaps between adjacent fin portions 201 in the second region II can be in a range from 1 to 4.

In some embodiments, the method of etching the multiple fin portions 201 in the second region II can include a dry etching process, a wet etching process, or a combination thereof.

It should be noted that, in some other embodiments, the first sacrificial layer may not cover the substrate in the first region, thereby exposing the multiple fin portions in the first region. Accordingly, during the etching process of the multiple fin portions in the second region, the multiple fin portions in the first region may also be etched to reduce the height of the multiple fin portions in the first region.

Referring to FIG. 8, the first sacrificial layer 203 and the second sacrificial layer 204 can be removed.

In some embodiments, the first sacrificial layer 203 and the second sacrificial layer 204 are organic antireflective coatings, and the first sacrificial layer 203 and the second sacrificial layer 204 can be removed by using washing water in a photolithography process.

In some other embodiments, the first sacrificial layer and the second sacrificial layer are silicon nitride, silicon oxide, or silicon oxynitride, which may be removed by using a dry etching process, a wet etching process, or a combination thereof.

It should be noted that, in some embodiments, after forming the isolation structure, and before removing the isolation structure in the second region, the multiple fin portions in the second region can be etched to reduce the height of the multiple fin portions in the second region.

Specifically, after forming the isolation structure, and before removing the isolation structure in the second region, a process for etching the multiple fin portions in the second region can include the following steps. Firstly, a sacrificial layer can be formed in the first region, and the sacrificial layer can cover the sidewalls and top surface of the multiple fin portions in the first region. Then, the multiple fin portions in the second region can be etched by using the sacrificial layer as a mask. Finally, the sacrificial layer can be removed.

Thus, after forming the isolation structure, and before removing the isolation structure in the second region, during the process for etching the multiple fin portions in the second region, the sacrificial layer can be used as a mask to etch the multiple fin portions in the second region. Therefore, the process flow of the fabrication method can be simplified.

In some other embodiments, the multiple fin portions in the second region may also be etched before forming the isolation structure.

Returning to FIG. 11, at step S1109, a first doped layer can be formed on the surface of the fin portion in the first region. And at step S1111, a second doped layer can be formed on the surface of the fin portion in the second region.

Figure 9:
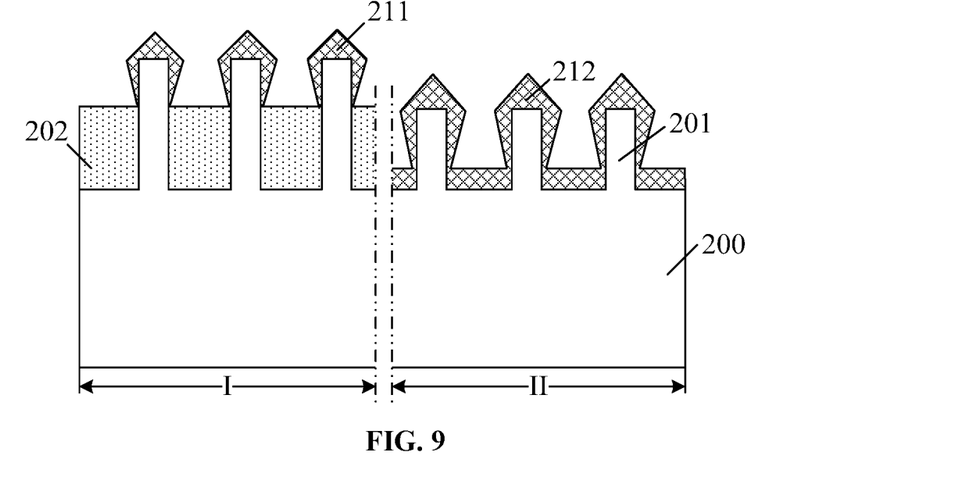

Referring to FIGS. 9 and 10, the first region I in FIG. 9 shows a cross-sectional view of the structure in FIG. 10 along the dashed line B-b, and the second region II in FIG. 9 shows a cross-sectional view of the structure in FIG. 10 along the dashed line A-a. As illustrated, a first doped layer 211 can be formed on the surface of the multiple fin portions 201 in the first region I, and a second doped layer 212 can be formed on the surface of the multiple fin portions 201 in the second region II.

In some embodiments, the first doped layer 211 can be sued as a source region of a transistor, and the second doped layer 212 can be used as a drain region of the transistor. In some embodiments, the first doped layer 211 and the second doped layer 212 can have a same type, and are both N-type semiconductors. Thus, the first doped layer 211 and the second doped layer 212 can be formed in a single process.

In some embodiments, the dopant ions in the first doped layer 211 and the second doped layer 212 can be the same type, and are both N-type ions. The specific dopant ions may be phosphorus ions or arsenic ions. In some other embodiments, dopant ions in the first doped layer and the second doped layer may also be different types.

In some other embodiments, the first doped layer and the second doped layer may be both P-type semiconductors. In addition, the types of the first doped layer and the second doped layer may be different, and the first doped layer and the second doped layer are formed in different processes.

In some embodiments, the first doped layer 211 and the second doped layer 212 can be formed by using an epitaxial growth process. During the epitaxial growth process, the first doped layer 211 and the second doped layer 212 can be in-situ doped to form the dopant ions in the first and second doped layers 211 and 212 respectively. In some other embodiments, the first doped layer and the second doped layer may also be formed by an ion implantation process.

It should be noted that, since there is no isolation structure on the substrate 200 in the second region II, the second doped layer 212 may also be formed on the surface of the substrate 200 in the second region II during the epitaxial growth process. As such, the contact area between the second doped layer 212 and the base substrate can be increased, thereby increasing the area of the base substrate that receives electrostatic charge, and resulting in an enhancing of the heat dissipation performance of the formed electrostatic discharge protection structure.

In some embodiments, the first doped layer 211 and the second doped layer 212 can be used to form N-type semiconductors. In the in-situ doping process of the first doped layer 211 and the second doped layer 212, the dopant ions can be phosphorus ions or arsenic ions. In some other embodiments, the first doped layer and the second doped layer are both P-type semiconductors, and the dopant ions can be boron ions or boron fluoride ions.

It should be noted that, in some embodiments, the type of the first dopant ions in the first well region 221 is opposite to the type of the dopant ions of the first doped layer 211 and the second doped layer 212. Therefore, the first dopant ions are P-type ions, such as boron ions. The type of the second dopant ions in the second well region 222 is the same as the type of the dopant ions of the first doped layer 211 and the second doped layer 212. Therefore, the second dopant ions are N-type ions, such as phosphorus ions or arsenic ions.

In some embodiments, the material of the first doped layer 211 and the second doped layer 212 can be silicon germanium or silicon. In some other embodiments, the first doped layer and the second doped layer may also be P-type semiconductors, and the materials of the first doped layer and the second doped layer may be carbon-silicon or silicon.

In some embodiments, a thickness of the first doped layer 211 can be in a range from 100 angstroms to 500 angstroms, for example 400 angstroms. A thickness of the second doped layer 212 can be in a range from 50 angstroms to 500 angstroms, for example, 350 angstroms.

Returning to FIG. 11, at step S1113, a gate structure crossing the fin portion can be formed in a gate region.

Referring to FIG. 10, in some embodiments, before forming the first doped layer 211 and the second doped layer 212, the fabricating method can further include forming a gate structure 210 across the multiple fin portions 201 in the gate region III. The gate structure 210 can cover a portion of the sidewalls and top surface of the multiple fin portions 201 in the gate region III.

In some embodiments, a channel can be formed in the first well region 221 and the second well region 222 of the multiple fin portions 201 below the gate structure 210.

In some embodiments, the gate structure 210 can include a gate dielectric layer and a gate electrode on the gate dielectric layer.

In some embodiments, the gate electrode can be a polysilicon gate electrode. In some other embodiments, the gate electrode may also be a metal gate electrode.

In some embodiments, the material of the gate dielectric layer can be silicon oxide. In some other embodiments, the material of the gate dielectric layer may also be a high-k dielectric material that has a dielectric constant greater than 3.9.

Thus, in the disclosed method for fabricating the electrostatic discharge protection structure of the various embodiments described above, the second doped layer can be formed not only on the surface of the multiple fin portions in the second region, but also on the surface of the substrate in the second region. Therefore, the contact area between the second doped layer and the base substrate can be increased, thereby increasing the cross-sectional area of the channel that the current flows through. Accordingly, the disclosed method can enhance the heat dissipation performance of the formed electrostatic discharge protection structure, and can improve the performance of the formed electrostatic discharge protection structure.

It should be noted that the above steps of the flow diagram of FIG. 11 can be executed or performed in any order or sequence not limited to the order and sequence shown and described in the figure. Also, some of the above steps of the flow diagram of FIG. 11 can be executed or performed substantially simultaneously where appropriate or in parallel to reduce latency and processing times. Furthermore, it should be noted that FIG. 11 is provided as an example only. At least some of the steps shown in the figure may be performed in a different order than represented, performed concurrently, or altogether omitted.

Still referring to FIGS. 9 and 10, in accordance with some embodiments, the present disclosure also provides an electrostatic discharge protection structure. As shown, the electrostatic discharge protection structure can include a base substrate including a substrate 200 and multiple fin portions 201 on the substrate 200. The base substrate can include a first region I and a second region II. A first doping layer 211 can be on the surface of the multiple fin portions 201 in the first region I. A second doping layer 212 can be on the surface of the multiple fin portions 201 and the substrate 200 in the second region II.

In some embodiments, the first region I is used for forming a source region, and the second region II is used for forming a drain region. In some other embodiments, the first region is used for forming a drain region, and the second region is used for forming a source region.

In some embodiments, the base substrate includes multiple fin portions 201 on the substrate 200 in the second region II, and multiple fin portions 201 on the substrate 200 in the first region I.

In some embodiments, the base substrate can further include a gate region III between the first region I and the second region II. The gate region III is used for forming a gate structure. The base substrate can further include an isolation region IV between the gate region III and the second region II. In some other embodiments, the base substrate may not include the gate region and the isolation region.

In some embodiments, the disclosed electrostatic discharge protection structure can further include a first well region 221 in the multiple fin portions 201 and the substrate 200, as well as a second well region 222 in the multiple fin portions 201 and the substrate 200. The second well region 222 can be in contact with the first well region 221.

In some embodiments, the first well region 221 has first dopant ions. The type of the first dopant ions are opposite to the type of dopant ions in the first doping layer 211. The second well region 212 has second dopant ions. The type of the second dopant ions are opposite to the type of the first dopant ions.

Specifically, in some embodiments, the first dopant ions are P-type ions, such as boron ions. The second dopant ions are N-type ions, such as phosphorus ions or arsenic ions. In some other embodiments, the first dopant ions may be N-type ions, and the second dopant ions may be P-type ions.

In some embodiments, the substrate 200 can be a silicon substrate. In some other embodiments, the substrate may be any other suitable semiconductor substrate, such as a germanium substrate, a silicon germanium substrate, or a silicon-on-insulator substrate.

In some embodiments, the material of the multiple fin portions 201 is silicon. In some other embodiments, the material of the multiple fin portions may be germanium or silicon germanium.

In some embodiments, the electrostatic discharge protection structure can further include an isolation structure 202 between the multiple fin portions 201 in the first region I. The top surface of the isolation structure 202 can be lower than the top surface of the multiple fin portions 201 in the first region I.

In some embodiments, the isolation structure 202 can also be located on the substrate 200 in the isolation region IV. The isolation structure 202 on the substrate 200 in the isolation region IV can increase the length of the channel that current flows through, thereby increasing the heat dissipation performance of the formed electrostatic discharge protection structure.

In some embodiments, the height of the multiple fin portions 201 in the second region II is lower than the height of the multiple fin portions 201 in the first region I. The height of the multiple fin portions 201 in the second region II is lowered than the height of the multiple fin portions 201 in the gate region III.

In some other embodiments, the height of the multiple fin portions in the first region may be equal to the height of the multiple fin portions in the second region. The height of the multiple fin portions in the second region and in the first region may be lower than the height of the multiple fin portions in the gate region.

In some embodiments, if the height of the multiple fin portions 201 in the second region II is too small, the contact arear between the second doped layer and the sidewalls of the multiple fin portions 201 may be too small to improve the heat dissipation performance of the formed electrostatic discharge protection structure. If the height of the multiple fin portions 201 in the second region II is too large, it is difficult to form the second doped layer on the substrate 200 in the second region II. Specifically, the height of the multiple fin portions 201 in the second region II can be in a range from 150 angstroms to 800 angstroms.

In some embodiments, the depth-to-width ratio of the gaps between adjacent fin portions 201 in the second region II is smaller than the depth-to-width ratio of the gaps between adjacent fin portions 201 in the gate region III. Since the depth-to-width ratio of the gaps between the multiple fin portions 201 in the second region II is small, the second doped layer 212 can adequately cover the surface of the substrate 200 in the first region I. Specifically, the depth-to-width ratio of the gaps between the adjacent fin portions 201 in the second region II can be in a range from 1 to 4.

It should be noted that, the second doped layer 212 on the substrate 200 in the second region II can increase the contact area between the second doped layer 212 and the base substrate, thereby increasing the area of the base substrate that receives electrostatic charge, and resulting in an enhancing of the heat dissipation performance of the formed electrostatic discharge protection structure.

In some embodiments, the first doped layer 211 can be used as a source region of a transistor, and the second doped layer 212 can be used as a drain region of the transistor.

In some embodiment, the first doped layer 211 and the second doped layer 212 can have a same type and are both N-type semiconductors. In some other embodiments, the first doped layer 211 and the second doped layer 212 may be both P-type semiconductors. In addition, the types of the first doped layer 211 and second doped layer 212 may be different.

In some embodiments, the first doped layer 211 and the second doped layer 212 contain same type of dopant ions. The first doped layer 211 and the second doped layer 212 can be both N-type semiconductors. The dopant ions can be phosphorus ions or arsenic ions. In some other embodiments, both the first doped layer 211 and the second doped layer 212 are P-type semiconductors, and the dopant ions are boron ions or $BF_2$ ions.

In some embodiments, the material of the first doped layer 211 and the second doped layer 212 can be silicon germanium or silicon. In some other embodiments, the first doped layer 211 and the second doped layer 212 may be P-type semiconductors, and the material of the first doped layer 211 and second doped layer 212 may be carbon-carbon or silicon.

In some embodiments, the thickness of the first doped layer 211 can be in a range from 100 angstroms to 500 angstroms, for example 400 angstroms. A thickness of the second doped layer 212 can be in a range from 50 angstroms to 500 angstroms, for example, 350 angstroms.

In some embodiments, the electrostatic discharge protection structure can further include a gate structure 210 located in the gate region III. The gate structure 210 can cover a portion of the sidewalls and top surface of the multiple fin portions 201 in the gate region III.

In some embodiments, the gate structure 201 can include a gate dielectric layer, and a gate electrode on the gate dielectric layer.

In some embodiment, the gate electrode is a polysilicon gate electrode. In some other embodiments, the gate electrode may be a metal gate electrode.

In some embodiments, the material of the gate dielectric layer can be silicon oxide. In some other embodiments, the material of the gate dielectric layer may be a high-k dielectric material that has a dielectric constant greater than 3.9.

Thus, in the disclosed electrostatic discharge protection structure of the various embodiments described above, the second doped layer can be formed not only on the surface of the multiple fin portions in the second region, but also on the surface of the substrate in the second region. Therefore, the contact area between the second doped layer and the base substrate can be increased, thereby increasing the cross-sectional area of the channel that the current flows through. Accordingly, the disclosed method can enhance the heat dissipation performance of the formed electrostatic discharge protection structure, and can improve the performance of the formed electrostatic discharge protection structure.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, an electrostatic discharge protection structure and a fabricating method thereof are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. An electrostatic discharge protection structure, comprising:
    a base substrate including a substrate and a fin portion on the substrate, wherein the substrate includes a first region and a second region;
    a first doped layer on a surface of the fin portion in the first region; and
    a second doped layer on a surface of the fin portion in the second region and on a surface of the substrate in the second region, wherein an aspect ratio of gaps between adjacent fin portions in the second region is smaller than an aspect ratio of gaps between adjacent fin portions in the first region; wherein:
    the second doped layer is directly on and completely covers a top surface and side surfaces of the fin portion in the second region, and a top surface of the substrate in the second region.

2. The electrostatic discharge protection structure of claim 1, wherein:
    the base substrate further includes a gate region between the first region and the second region;
    the electrostatic discharge protection structure further comprises a gate structure on the base substrate in the gate region; and
    the first doped layer and the second doped layer are of a same type.

3. The electrostatic discharge protection structure of claim 2, further comprising an isolation structure on the base substrate between the second region and the gate region.

4. The electrostatic discharge protection structure of claim 3, wherein:
    the isolation structure on the base substrate between the second region and the gate region increases a length between the second region and the gate region.

5. The electrostatic discharge protection structure of claim 2, further comprising:
    a first well region formed in the fin portion in the first region and a portion of the gate region; and
    a second well region formed in the fin portion in the second region and a remaining portion of the gate region.

6. The electrostatic discharge protection structure of claim 1, wherein:
    the first doped layer is in contact with the second doped layer; and
    the first doped layer and the second doped layer are of opposite types.

7. The electrostatic discharge protection structure of claim 1, wherein a height of the fin portion in the second region is less than a height of the fin portion in the first region.

8. The electrostatic discharge protection structure of claim 1, wherein a height of the fin portion in the second region is in a range from 150 angstroms to 800 angstroms.

9. The electrostatic discharge protection structure of claim 1, wherein:
    the base substrate includes a plurality of fin portions on the substrate in the second region; and
    a depth-to-width ratio of gaps between adjacent fin portions in the second region is in a range from 1 to 4.

10. The electrostatic discharge protection structure according to claim 1, wherein a thickness of the second doped layer is in a range from 50 angstroms to 500 angstroms.

11. The electrostatic discharge protection structure of claim 1, wherein:
    the first doped layer covers a top surface and a portion of side surfaces of the fin portion in the first region.

12. The electrostatic discharge protection structure of claim 1, wherein:
    the second doped layer covers a top surface and side surfaces of the fin portion in the second region, and a top surface of the substrate in the second region.

13. The electrostatic discharge protection structure of claim 1, wherein:
    the second doped layer completely covers a top surface of the substrate in the second region.

14. The electrostatic discharge protection structure of claim 1, wherein:
    a first well region in the first region has first dopant ions and a second well region in the second region has second doped ions; and
    a type of the second dopant ions is opposite to a type of the first dopant ions.

* * * * *